United States Patent
Lee

(10) Patent No.: US 8,669,132 B2
(45) Date of Patent: Mar. 11, 2014

(54) SEPARATION TYPE UNIT PIXEL OF 3-DIMENSIONAL IMAGE SENSOR AND MANUFACTURING METHOD THEREOF

(75) Inventor: Do Young Lee, Seongnam-si (KR)

(73) Assignee: Siliconfile Technologies Inc., Seoul (KR)

( * ) Notice: Subject to any disclaimer, the term of this patent is extended or adjusted under 35 U.S.C. 154(b) by 0 days.

(21) Appl. No.: 13/531,530

(22) Filed: Jun. 23, 2012

(65) Prior Publication Data

US 2012/0264251 A1    Oct. 18, 2012

Related U.S. Application Data

(62) Division of application No. 11/917,983, filed as application No. PCT/KR2006/002482 on Jun. 27, 2006, now Pat. No. 8,325,221.

(30) Foreign Application Priority Data

Jun. 28, 2005    (KR) .......................... 10-2005-0056036

(51) Int. Cl.
*H01L 21/00*    (2006.01)

(52) U.S. Cl.
USPC .......................................................... 438/57

(58) Field of Classification Search
USPC .......................................................... 438/57
See application file for complete search history.

(56) References Cited

U.S. PATENT DOCUMENTS 4,561,015 A  *  12/1985  Korch ........................... 348/340
8,405,177 B2 *  3/2013  Hsu et al. ...................... 257/431

OTHER PUBLICATIONS

Suntharalingam et al., ("Megapixel CMOS Image Sensor Fabricated in Three-Dimensional Integrated Circuit Technology", Feb. 5, 2005, IEEE International Solid-State Circuits Conference).*

* cited by examiner

*Primary Examiner* — Charles Garber
*Assistant Examiner* — Andre' C Stevenson
(74) *Attorney, Agent, or Firm* — Kile Park Reed & Houtteman PLLC

(57) ABSTRACT

A separation type unit pixel of an image sensor, which can control light that incidents onto a photodiode at various angles, and be suitable for a zoom function in a compact camera module by securing an incident angle margin, and a manufacturing method thereof are provided. The unit pixel of an image sensor includes: a first wafer including a photodiode containing impurities having an impurity type opposite to that of a semiconductor material and a pad for transmitting photoelectric charge of the photodiode to outside; a second wafer including a pixel array region in which transistors except the photodiode are arranged regularly, a peripheral circuit region having an image sensor structure except the pixel array, and a pad for connecting pixels with one another; and a connecting means connecting the pad of the first wafer and the pad of the second wafer.

2 Claims, 10 Drawing Sheets

SEPARATION TYPE UNIT PIXEL OF 3-DIMENSIONAL IMAGE SENSOR AND MANUFACTURING METHOD THEREOF

CROSS REFERENCE TO RELATED APPLICATIONS

This application is a divisional application of U.S. patent application Ser. No. 11/917,983, filed on Dec. 18, 2007, the disclosure of which is herein incorporated by reference in its entirety. The U.S. patent application Ser. No. 11/917,983 is a national entry of International Application No. PCT/KR2006/002482, filed on Jun. 27, 2006, which claims priority to Korean Application No. 10-2005-0056036 filed on Jun. 28, 2005, the entire contents of which are incorporated herein by reference.

TECHNICAL FIELD

The present invention relates to a unit pixel of an image sensor, and more particularly, to a unit pixel of image sensor in which a photodiode is separated from a pixel array region and a manufacturing method thereof.

BACKGROUND ART

Pixels used in conventional image sensors are generally classified as 3-transistor pixels, 4-transistor pixels, or 5-transistor pixels according to the number of transistors included therein.

FIGS. 1 to 3 show a typical pixel structure used for an image sensor, according to the number of transistors;

FIG. 1 shows a 3-transistor structure. FIGS. 2 and 3 show a 4-transistor structure.

As shown in FIGS. 1 to 3, a fill factor that is the area occupied by the photodiode over the entire area of the pixel is naturally reduced due to the existence of transistors in a pixel circuit. In general, the fill factor of a diode ranges from 20 to 45%, considering capability of each semiconductor manufacturing process. Accordingly, light that is incident onto the rest area corresponding to about 55-80% of the entire area of the pixel is lost.

To minimize the loss of optical data, a microlens is used for each unit pixel in a manufacturing process of the image sensor so that the optical data can be condensed onto the photodiode of each pixel. A microlens gain is defined as an increment of the sensitivity of a sensor using the microlens with respect to the sensitivity of the image sensor without the microlens.

Given that the fill factor of a common diode is about 30's %, the microlens gain is 2.5-2.8 times of the sensitivity of the image sensor without the microlens. However, a pixel size has decreased to 4 μm×4 μm, and even to 3 μm×3 μm. Further, with an emergence of a small-sized pixel of 2.8 μm×2.8 μm or 2.5 μm×2.5 μm, starting from when the pixel size is 3.4 μm×3.4 μm, the microlens gain significantly drops from 2.8 times to 1.2 times of the sensitivity of the image sensor without the microlens. This is caused by diffraction phenomenon of the microlens. The severity of diffraction phenomenon is determined by a function of a pixel size and a position of the microlens.

As the pixel size gradually decreases, the severity of diffraction phenomenon of the microlens increases, thereby dropping the microlens gain equal to or less than 1.2 times of the sensitivity of the image sensor, which results in a phenomenon where the light condensation seems to be unavailable. This is newly being recognized as a cause of sensitivity deterioration.

In general, the decrease of the pixel size of the image sensor results in the decrease of the area of the photodiode. The area of the photodiode is closely related to the amount of available electric charge of the photodiode. Accordingly, the amount of available electric charge decreases when the size of the photodiode decreases. The amount of available charge of the photodiode is a basic factor for determining a dynamic range of the image sensor, and therefore the decrease of the amount of available electric charge directly affects the image quality of the sensor. When the image sensor of which the pixel size is less than 3.2 μm×3.2 μm is manufactured, its sensitivity decreases, and the dynamic range of the sensor with respect to the light also decreases, thereby deteriorating the image quality.

An external lens is used in the process of manufacturing a camera module using the image sensor. In this case, light is substantially perpendicularly incident onto a center portion of a pixel array. However, the light is less perpendicularly incident onto edge portions of the pixel array. When an angle starts to deviate from the vertical angle by a predetermined degree, the light is condensed onto the microlens which is out of the area pre-assigned for condensation of the photodiode. This generates a dark image, and more seriously, when the light is condensed onto a photodiode of an adjacent pixel, chromaticity may change.

Recently, with the development of the image sensor having from 0.3 million pixels and 1.3 million pixel to 2 million pixels and 3 million pixels, a dynamic zoom-in/zoom-out function as well as an automatic focus function are expected to be included in a compact camera module.

The features of the functions lie in that the incident angle of the light significantly changes at edge portions while each function is performed. The chromaticity or brightness of the sensor has to be independent of changes in the incident angle. With the decrease of the pixel size, the sensor cannot cope with the changes in the incident angle. At present, the sensor can support the automatic focus function, but the sensor can not support the dynamic zoom-in/zoom-out function. Therefore, it is difficult to develop a compact camera module providing a zoom function.

DETAILED DESCRIPTION OF THE INVENTION

Technical Goal of the Invention

In order to solve the aforementioned problems, an object of the present invention is to provide a separation type unit pixel of an image sensor of which sensitivity drops far lesser than a conventional case in the manufacturing of a minute pixel, capable of controlling light incident onto a photodiode at various angles, and providing a zoom function in a compact camera module by securing an incident angle margin, and a manufacturing method thereof.

DISCLOSURE OF THE INVENTION

According to an aspect of the present invention, there is provided a separation type unit pixel having a 3D structure for an image sensor including: a first wafer including a photodiode containing impurities having an impurity type opposite to that of a semiconductor material and a pad for transmitting photoelectric charge of the photodiode to outside; a second wafer including a pixel array region in which transistors except the photodiode are arranged regularly, a peripheral circuit region having an image sensor structure except the pixel array, and a pad for connecting pixels with one another;

and a connecting means connecting the pad of the first wafer and the pad of the second wafer.

According to another aspect of the present invention, there is provided a manufacturing method of a separation type unit pixel having a 3D structure for an image sensor, the method including: (a) constructing a first wafer including only a photodiode formed by implanting impurity ions into a semiconductor substrate; (b) constructing a second wafer including a pixel array region excluding the photodiode and a peripheral circuit region; (c) arranging the first wafer and the second wafer up and down for pixel array arrangement; (d) adhering a pad of a unit pixel on the first and second wafer arranged up and down; and (e) forming a color filter on the first wafer.

BEST MODE FOR CARRYING OUT THE INVENTION

Hereinafter, the present will be described in detail with reference to accompanying drawings.

FIGS. 4 to 7 are circuit diagrams showing a structure of a separation type unit pixel for an image sensor, including a photodiode and four transistors, according to the present invention, in which a photodiode region is separated from a pixel array region including four transistors. It is shown that a pixel array region having a four transistor (4T) structure including a transmission transistor, a reset transistor, a source follower transistor, and a selection transistor is separated from the photodiode.

Here, methods of arranging the pixels having the 4T structure are various.

A structure of the separation type unit pixel of the image sensor according to the present invention may be employed for N-type and P-type MOS transistors.

Figure 1:
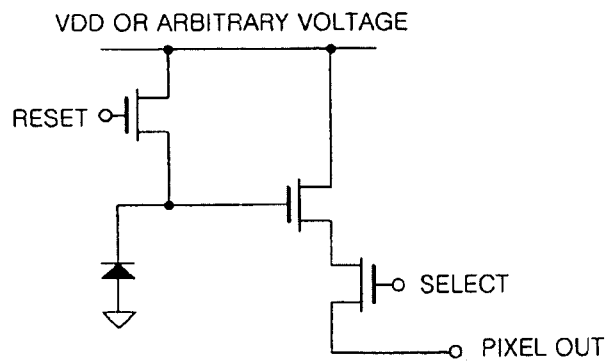
FIGS. 1 to 3 show a structure of a pixel according to the number of transistors typically used for an image sensor.
Figure 2:
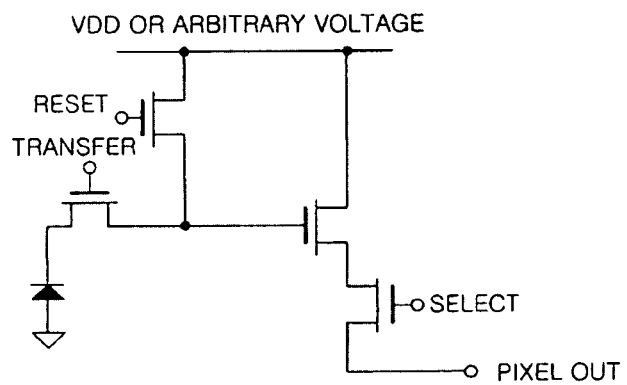
Figure 3:
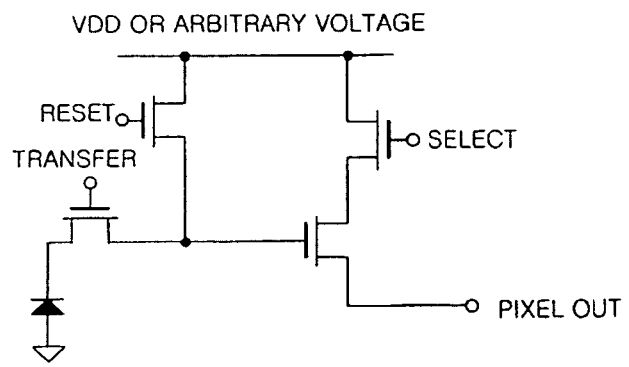
Figure 4:
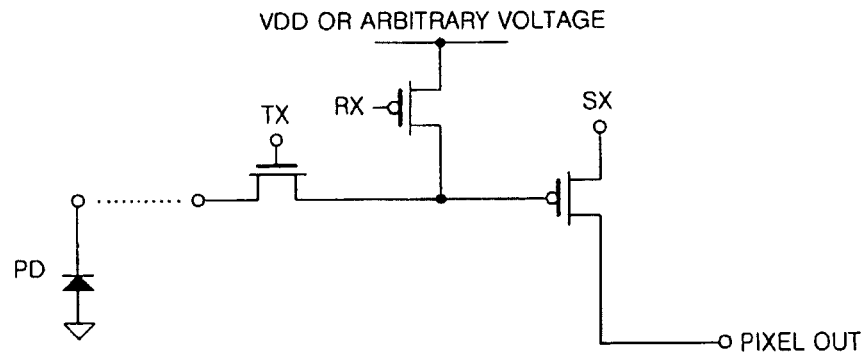
FIGS. 4 to 7 are circuit diagrams showing a structure of a separation type unit pixel for an image sensor, including a photodiode and four transistors, according to the present invention.
Figure 5:
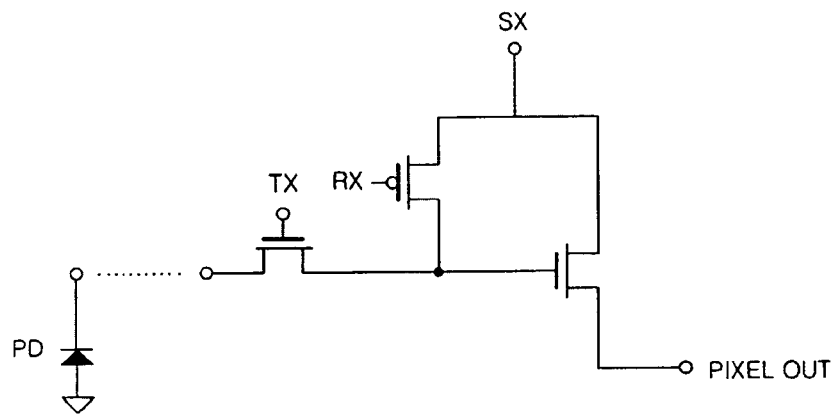
Figure 6:
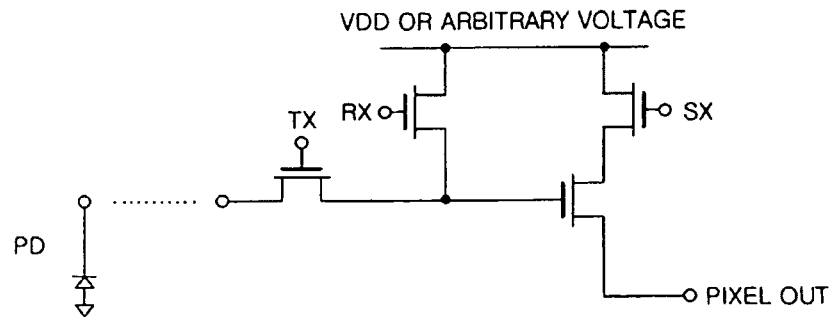
Figure 7:
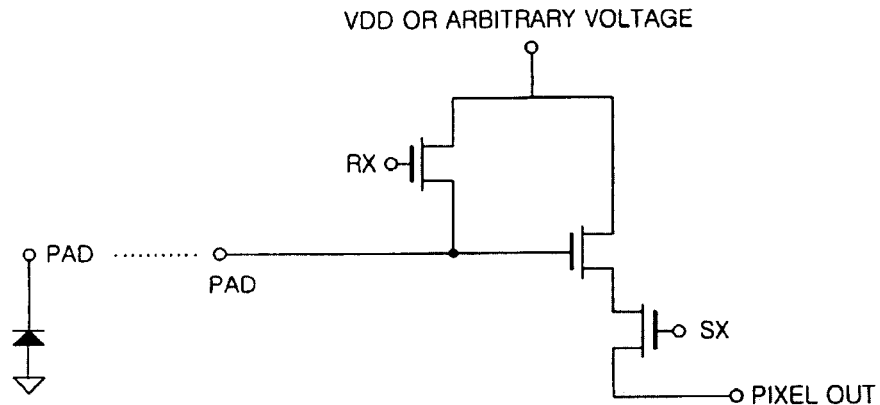
Figure 8:
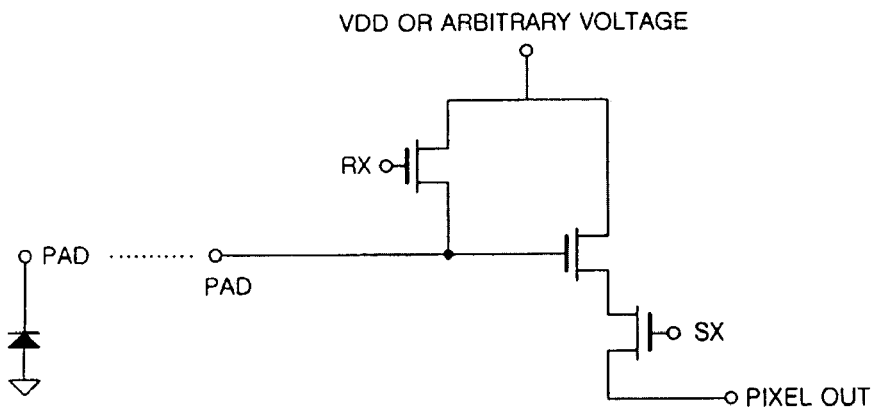
FIGS. 8 to 11 are circuit diagrams showing a structure of a separation type unit pixel for an image sensor, including a photodiode and four transistors, according to an embodiment of the present invention.
Figure 9:
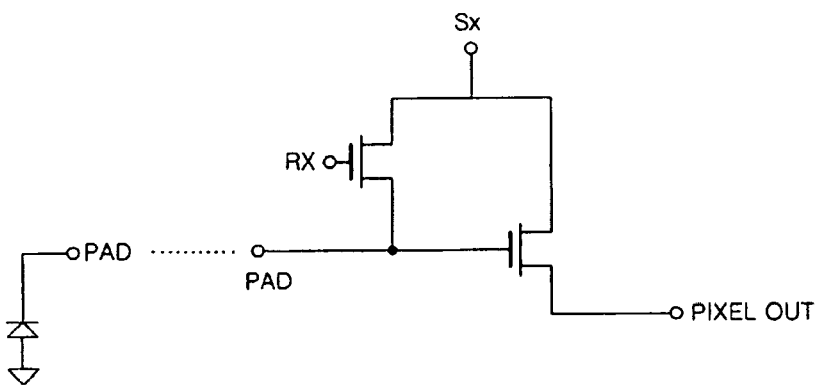

FIGS. 8 and 9 are circuit diagrams showing a structure of a separation type unit pixel for an image sensor according to an embodiment of the present invention in which a photodiode region is separated from a pixel array region including three transistors.

It is shown that the pixel array region having a three transistor (3T) structure including a reset transistor, a source follower transistor and a selection transistor is separated from the photodiode.

Figure 10:
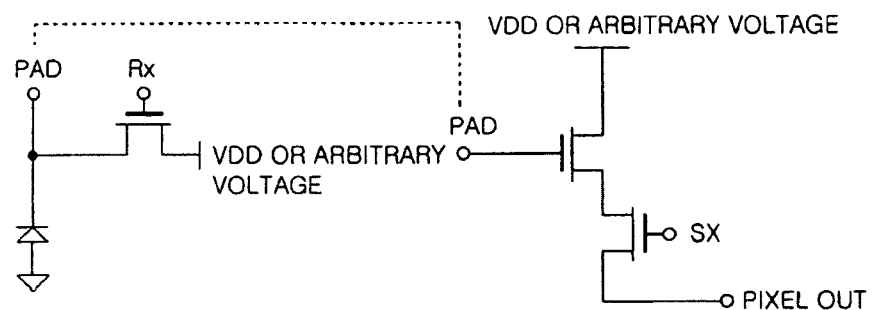
Figure 11:
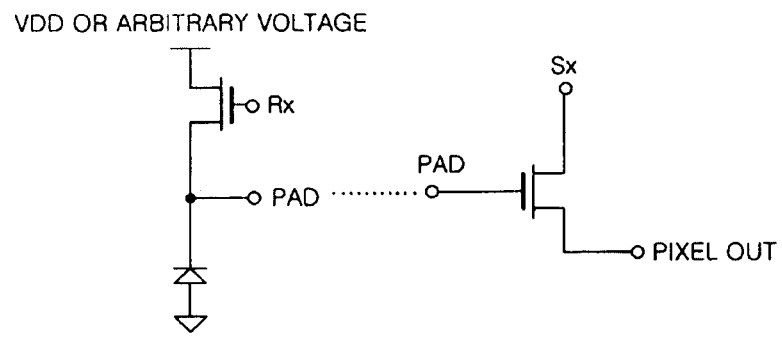

FIGS. 10 and 11 are circuit diagrams showing a structure of a separation type unit pixel for an image sensor according to another embodiment of the present invention.

It is shown that a region where the photodiode and the reset transistor are formed is separated from a pixel array region where the rest of the transistors except the reset transistor in the 3T structure are formed.

Here, methods of arranging the pixels having the 3T structure are various. A structure of the separation type unit pixel of the image sensor according to the present invention may be employed for N-type and P-type MOS transistors.

Figure 12:
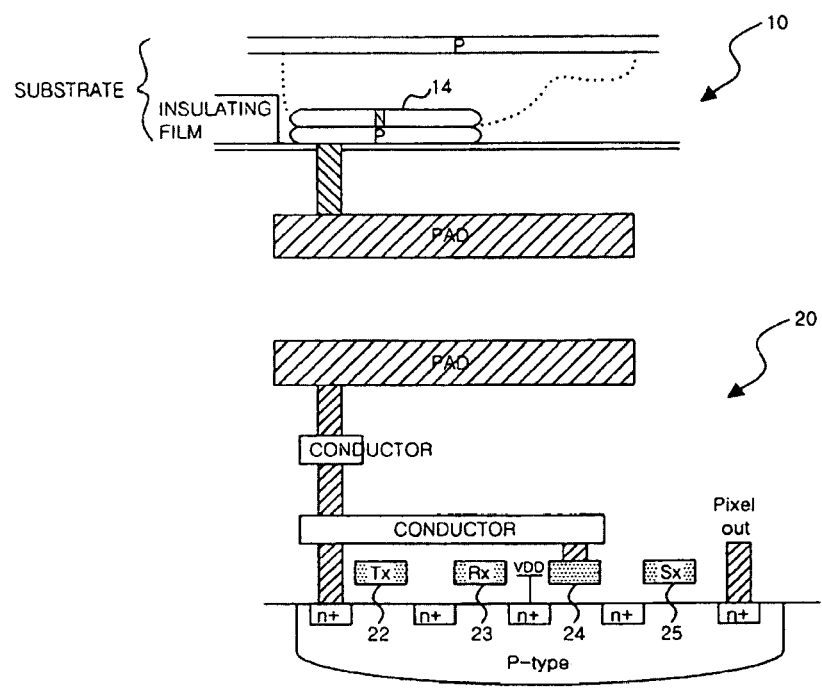
FIG. 12 shows a physical structure of a separation type unit pixel for an image sensor according to an embodiment of the present invention.

FIG. 12 shows a physical structure of a separation type unit pixel for an image sensor according to an embodiment of the present invention which includes first and second wafer 10 and 20.

The first wafer 10 includes the photodiode 14 having a P-type semiconductor structure by implanting impurities into a semiconductor substrate and a pad 17 transmitting photoelectric charge of the photodiode 14 to outside.

The second wafer 20 includes a pixel array region where the circuit elements except the photodiode including transistors are regularly arranged, a peripheral circuit region, and a pad 21 connecting pixels with one another.

In the pixel array region, the rest of the circuit elements constituting a pixel (i.e., a transmission transistor 22, a reset transistor 23, a source follower transistor 24 and/or a selection transistor 25) are regularly arranged. In the peripheral circuit region, a circuit for reading a signal of the image sensor, a correlated double sampling (CDS) circuit, a circuit for processing a general analogue signal, other digital control circuit, and a digital circuit for processing an image signal are included.

Figure 13:
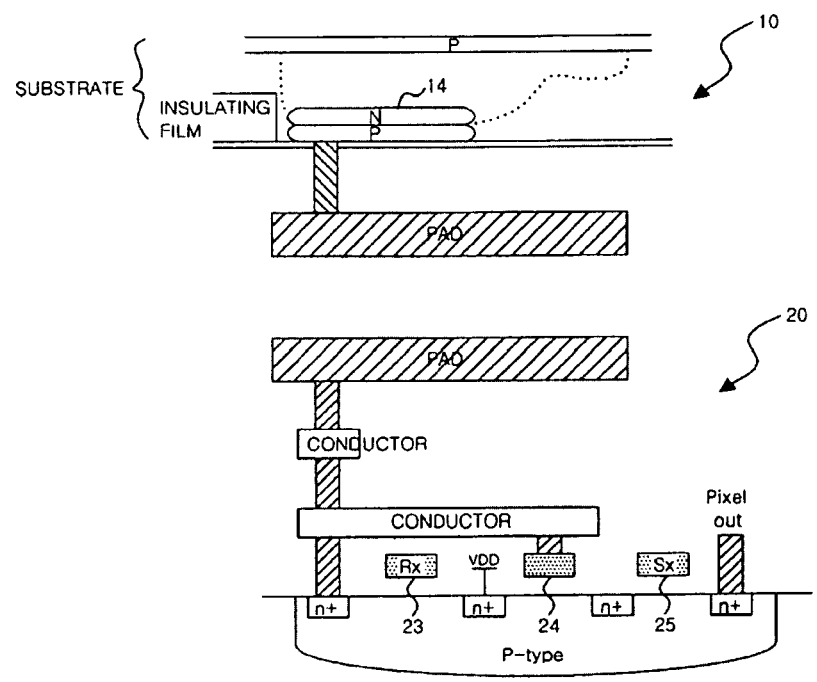
FIG. 13 shows a physical structure of a separation type unit pixel for an image sensor according to another embodiment of the present invention.

FIG. 13 shows a physical structure of a separation type unit pixel for an image sensor according to another embodiment of the present invention in which the second wafer 20 has a 3T structure.

Specifically, in the pixel array region of the second wafer 20, the rest of the circuit elements constituting a pixel (i.e., a reset transistor 23, a source follower transistor 24 and/or a selection transistor 25) are regularly arranged.

Figure 14:
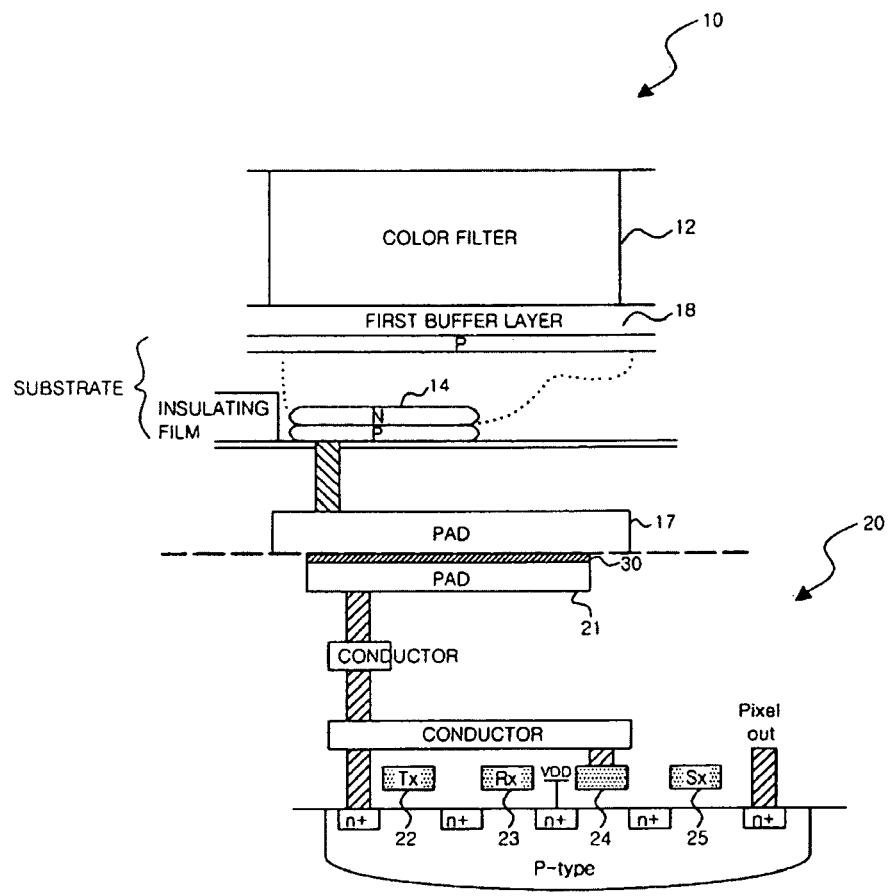
FIG. 14 shows a separation type unit pixel for a 3-dimensional image sensor according to an embodiment of the present invention.

FIG. 14 shows a separation type unit pixel having a 3D structure for an image sensor according to an embodiment of the present invention in which the first wafer 10 is separated from the second wafer 20.

The first wafer 10 includes a color filter 12 and the photodiode 14.

The second wafer 20 includes a pixel array region where elements including transistors are regularly arranged and a peripheral circuit region constituting an image sensor structure including the rest of the pixel elements except the pixel array.

The first and second wafer 10 and 20 are connected to conductor layers 17 and 21 for external connection.

The first wafer portion 10 will now be described in detail.

The first wafer 10 includes the color filter 12 allowing each pixel to display a specific color, a semiconductor material 13 containing specific impurities used to form the photodiode 14, a first transparent buffer layer 18 to be inserted between the color filter 12 and the semiconductor material 13 so as to facilitate the formation of structures and improve the light transmittance, and the photodiode containing impurities having an impurity type opposite to that of the semiconductor material 13.

In addition, a conductor pad 17 for external connection is formed in the first wafer portion 10 according to the present invention.

The second wafer portion 20 will now be described in detail.

The second wafer portion 20 is divided into the pixel array region having a 3T or 4T structure and the peripheral circuit region. The peripheral circuit region has a typical image sensor structure. Accordingly, the peripheral circuit region may include a circuit for reading an image sensor signal, a CDS circuit, a circuit for processing a common analog signal, a digital control circuit, and an image signal processing digital circuit.

In the pixel array region, pixel elements except the photodiode which constitute the pixel are regularly arranged. An example of this is shown in the lower part of FIG. 12. First, the pixel array region includes a conductor pad 21 for receiving a signal from the upper part of the pixel array region, a reset transistor for initializing the photodiode 14, a source follower transistor 24 for transmitting voltage statuses of a voltage source VDD and a floating diffusion region 15, that is a floating node, to outside, a selection transistor 25 for controlling connection between a pixel and an external lead-out circuit to transmit information of the pixel, and an output electrode 26 of the pixel.

Figure 15:
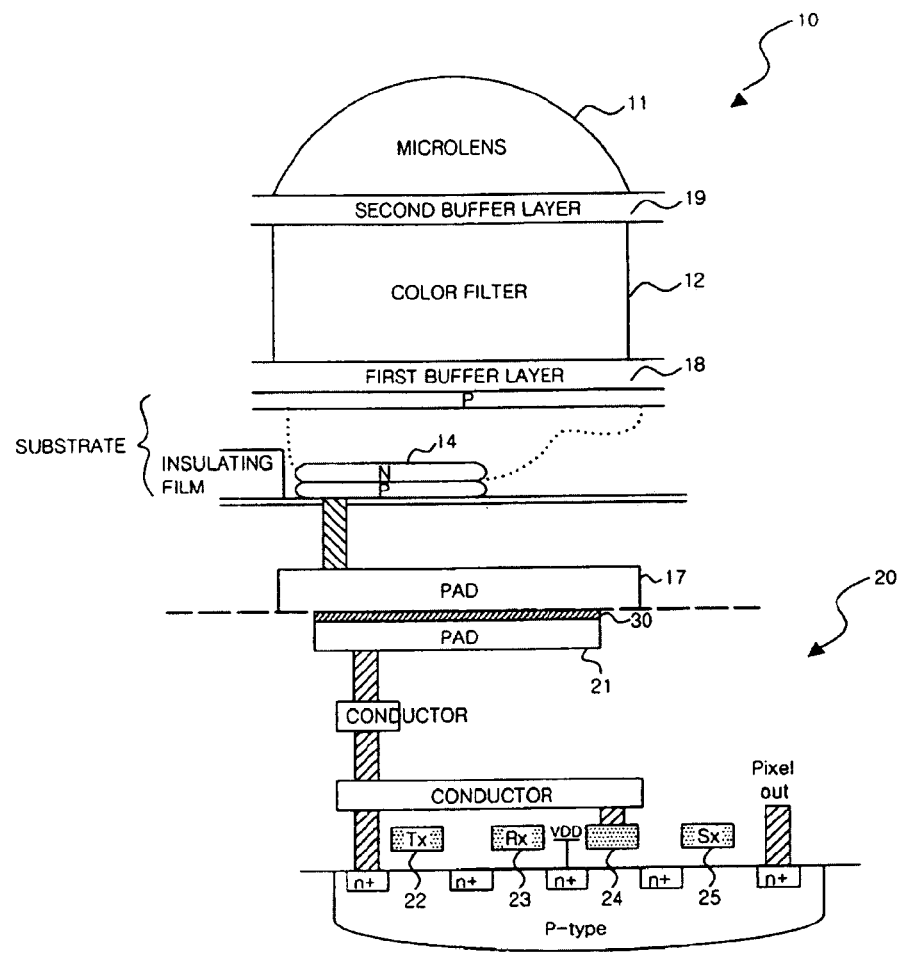
FIG. 15 shows a separation type unit pixel having a 3D structure for an image sensor according to another embodiment of the present invention.

FIG. 15 shows a separation type unit pixel for a 3-dimensional image sensor according to another embodiment of the present invention.

The unit pixel of FIG. 15 further includes a microlens 11 condensing light onto the photodiode and a second transparent buffer layer 19 which is inserted to facilitate the formation of structures and improve the light transmittance. The second transparent buffer layer 19 is additionally used and corresponds to the membrane of a common image sensor.

Figure 16:
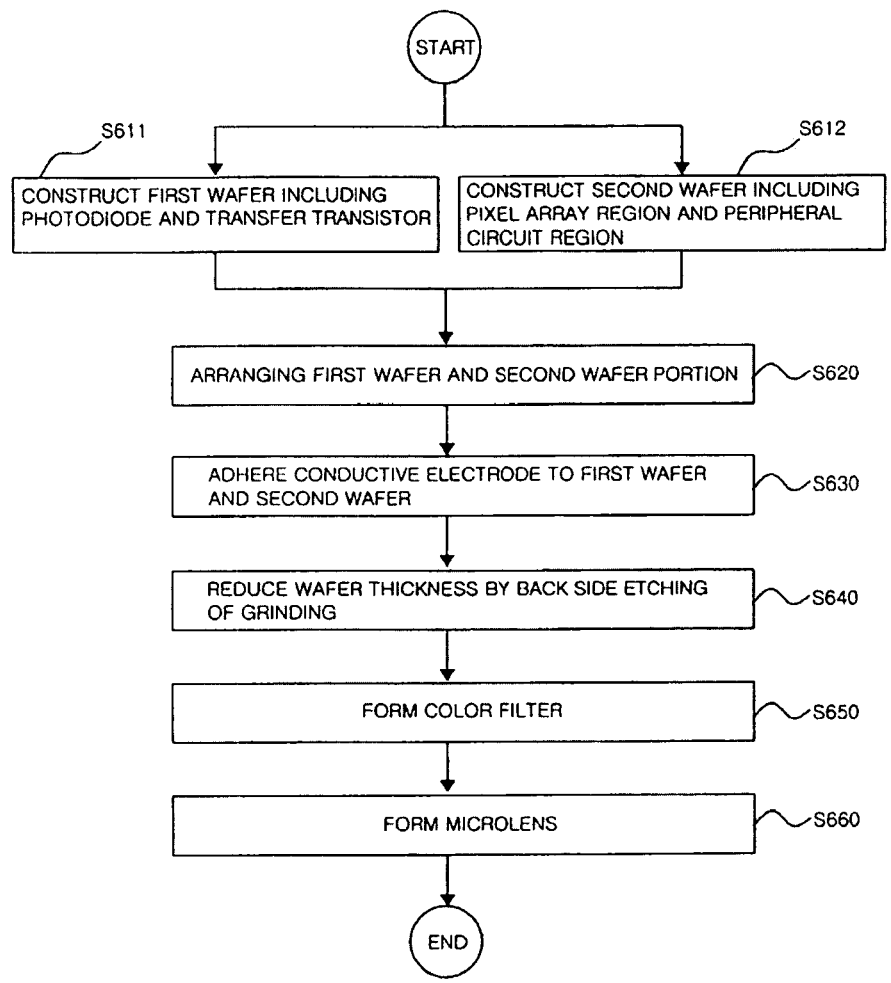
FIG. 16 is a flowchart of a method of manufacturing a separation type unit pixel having a 3D structure for an image sensor according to the present invention.

FIG. 16 is a flowchart of a manufacturing method of a separation type unit pixel having a 3-dimensional structure for an image sensor according to the present invention.

First, a first wafer is constructed with only a photodiode formed by implanting impurity ions into the semiconductor substrate (operation S611).

In the process of constructing the first wafer portion, a second wafer portion is constructed to have the pixel array region including a transmission transistor, a reset transistor, a source follower transistor, and a blocking switch transistor and the peripheral circuit region including a lead-out circuit, a vertical/horizontal decoder, a CDS circuit which involves in a sensor operation and an image quality, and analog circuit, an analog-digital converter (ADC), and a digital circuit (operation S612).

Second, the first wafer and the second wafer are arranged up and down (operation S620).

To arrange the first wafer and the second wafer up and down, the wafer portions may be arranged in an optical manner by making a hole in the first wafer by using an infrared ray (IR) penetrating method, an etching method, or a laser punching method.

In the IR penetrating method, the wafer are disposed without making a hole in the first wafer. In the etching method or the laser punching method, a hole is formed through the first wafer, and then the wafer are arranged through optical pattern recognition.

Third, the first and second wafer arranged up and down are adhered to a conductor pad (operation S630).

Fourth, the surface thickness of the back side of the first wafer portion is reduced to form thin back side of the first wafer (operation S640).

After the first wafer is adhered to the second wafer, the back side of the first wafer is thinned to reduce the wafer thickness. In order to reduce the thickness of the back side of the first wafer, the back side of the wafer is processed by a grinding process, a chemical mechanical polishing (CMP) process, or an etching process.

Fifth, a color filter is formed on the first wafer (operation S650).

Sixth, a microlens is formed on the color filter (operation S660).

Figure 17:
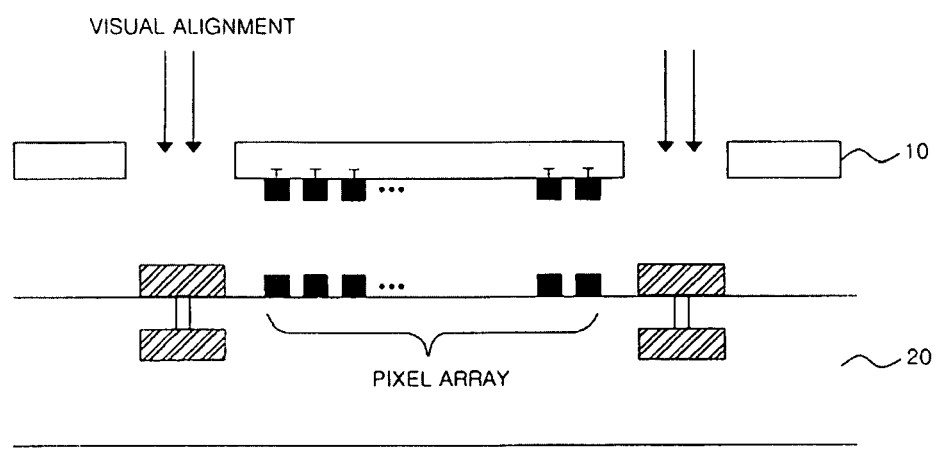
FIG. 17 shows a method of arranging a first wafer and a second wafer when manufacturing a separation type unit pixel having a 3D structure for an image sensor.

FIG. 17 shows an arrangement of the first and second wafer when manufacturing a separation type unit pixel having a 3D structure for an image sensor, according to an embodiment of the present invention.

The first and second wafer 10 and 20 are accurately aligned by using the IR penetrating method, the etching method, or the laser punching method.

In FIG. 17, a hole is formed through the first wafer 10 by using the etching method or the laser punching method.

The hole is not formed through the first wafer in using the IR penetrating method.

The manufacturing method of a separation type unit pixel having a 3D structure for an image sensor of the present invention is not limited to a CMOS manufacturing process, and the method may be used in other semiconductor manufacturing processes.

While the present invention has been particularly shown and described with reference to exemplary embodiments thereof, it will be understood by those of ordinary skill in the art that various changes in form and details may be made therein without departing from the spirit and scope of the present invention as defined by the following claims.

INDUSTRIAL APPLICABILITY

Accordingly, the present invention has advantages in that, manufacturing processes can be simplified by constructing the upper wafer using only a photodiode and the lower wafer using the pixel array region except the photodiode, and costs are reduced since transistors are not included in the upper wafer, which in turn cannot affect the interaction with light.

In addition, the present invention has advantages in that, by forming an area for a photodiode almost the same as an area for a pixel, an image sensor can be manufactured to have a good sensitivity in a subminiature pixel, without a microlens. In addition, by disposing the photodiode at the top layer, an incident angle margin of incident light can be secured, which has to be basically provided by the sensor for its auto focusing function or zoom function.

The invention claimed is:

1. A manufacturing method of a separation type unit pixel comprising a plurality of transistors for an image sensor, the method comprising:

constructing a first wafer comprising a photodiode formed by implanting impurity ions into a semiconductor substrate;

constructing a second wafer comprising a pixel array region except the photodiode and a peripheral circuit region;

arranging the first wafer and the second wafer up and down for pixel array arrangement;

adhering a pad of a unit pixel on the first wafer and the second wafer arranged up and down;

forming a first transparent buffer layer on the first wafer;

forming a color filter on the first wafer;
forming a second transparent buffer layer on the first wafer; and
forming a microlens on the first wafer,
wherein the first transparent buffer layer is positioned between the semiconductor substrate and the color filter, and
wherein the second transparent buffer layer is positioned between the color filter and the microlens.

2. The method of claim 1, further comprising:
performing surface processing for thinning the back side of the first wafer to reduce the thickness of the back side of the first wafer.

\* \* \* \* \*